United States Patent
Hazbun et al.

(10) Patent No.: US 12,040,252 B2
(45) Date of Patent: Jul. 16, 2024

(54) MICROFLUIDIC CHANNELS SEALED WITH DIRECTIONALLY-GROWN PLUGS

(71) Applicant: GlobalFoundries U.S. Inc., Malta, NY (US)

(72) Inventors: Ramsey Hazbun, Colchester, VT (US); Cameron Luce, Colchester, VT (US); Siva P. Adusumilli, South Burlington, VT (US); Mark Levy, Williston, VT (US)

(73) Assignee: GlobalFoundries U.S. Inc., Malta, NY (US)

( * ) Notice: Subject to any disclaimer, the term of this patent is extended or adjusted under 35 U.S.C. 154(b) by 98 days.

(21) Appl. No.: 17/858,660

(22) Filed: Jul. 6, 2022

(65) Prior Publication Data

US 2024/0014101 A1 Jan. 11, 2024

(51) Int. Cl.
  *H01L 23/473* (2006.01)
  *H01L 21/762* (2006.01)
  *H01L 23/367* (2006.01)
  *H01L 29/51* (2006.01)

(52) U.S. Cl.
  CPC ...... *H01L 23/473* (2013.01); *H01L 21/76229* (2013.01); *H01L 23/367* (2013.01); *H01L 29/515* (2013.01)

(58) Field of Classification Search
  CPC ............................ H01L 23/473; H01L 23/367
  See application file for complete search history.

(56) References Cited

U.S. PATENT DOCUMENTS

| | | | |
|---|---|---|---|
| 6,992,367 B2 | 1/2006 | Erratico et al. | |
| 8,106,436 B2 | 1/2012 | Grivna et al. | |
| 10,446,643 B2 | 10/2019 | Adusumilli et al. | |
| 2011/0233635 A1* | 9/2011 | Grivna | H01L 29/7813 257/334 |
| 2021/0010971 A1* | 1/2021 | Campanella-Pineda | G01N 27/414 |

OTHER PUBLICATIONS

M. J. de Boer et al., "Micromachining of buried micro channels in silicon," in Journal of Microelectromechanical Systems, vol. 9, No. 1, pp. 94-103, doi: 10.1109/84.825783 (Mar. 2000).
Yu, Q. et al., "Fabrication Method of Microfluidic Channels with Circular Cross Section for Micro-Coriolis Mass Flow Sensor," The 4th Conference on MicroFluidic Handling Systems; pp. 103-105 (Oct. 2-4, 2019).
Howe, R.T. "Recent Advances in Surface Micromachining," T. IEE Japan, vol. 116-E, No. 3, pp. 90-97 (1996).

* cited by examiner

*Primary Examiner* — Raj R Gupta
(74) *Attorney, Agent, or Firm* — Thompson Hine LLP; Francois Pagette

(57) ABSTRACT

Structures for a microfluidic channel and methods of forming a structure for a microfluidic channel. The structure comprises a trench in a semiconductor substrate and a semiconductor layer inside the trench. The trench has an entrance and a sidewall extending from the entrance into the semiconductor substrate. The semiconductor layer has a first portion surrounding a portion of the trench to define a cavity and a second portion positioned to obstruct the entrance to the trench. The second portion of the semiconductor layer is thicker than the first portion of the semiconductor layer.

20 Claims, 4 Drawing Sheets

MICROFLUIDIC CHANNELS SEALED WITH DIRECTIONALLY-GROWN PLUGS

BACKGROUND

This disclosure relates generally to semiconductor devices and integrated circuit fabrication and, in particular, to structures for a microfluidic channel and methods of forming a structure for a microfluidic channel.

Microfluidic systems may rely on microfluidic channels to control and to manipulate the flow of small fluidic volume on a chip. For example, microfluidic channels can supply fluid passages in a microfluidic system in order to perform on-chip biological analysis, or can be used as fluid passages to supply fluid flow for chip cooling.

Improved structures for a microfluidic channel and methods of forming a structure for a microfluidic channel are needed.

SUMMARY

In an embodiment of the invention, a structure comprises a trench in a semiconductor substrate and a semiconductor layer inside the trench. The trench has an entrance and a sidewall extending from the entrance into the semiconductor substrate. The semiconductor layer has a first portion surrounding a portion of the trench to define a cavity and a second portion positioned to obstruct the entrance to the trench. The second portion of the semiconductor layer is thicker than the first portion of the semiconductor layer.

In an embodiment of the invention, a method comprises forming a trench in a semiconductor substrate and forming a semiconductor layer inside the trench. The trench has an entrance and a sidewall extending from the entrance into the semiconductor substrate. The semiconductor layer has a first portion surrounding a portion of the trench to define a cavity and a second portion positioned to obstruct the entrance to the trench. The second portion of the semiconductor layer is thicker than the first portion of the semiconductor layer.

BRIEF DESCRIPTION OF THE DRAWINGS

The accompanying drawings, which are incorporated in and constitute a part of this specification, illustrate various embodiments of the invention and, together with a general description of the invention given above and the detailed description of the embodiments given below, serve to explain the embodiments of the invention.

DETAILED DESCRIPTION

Figure 1:
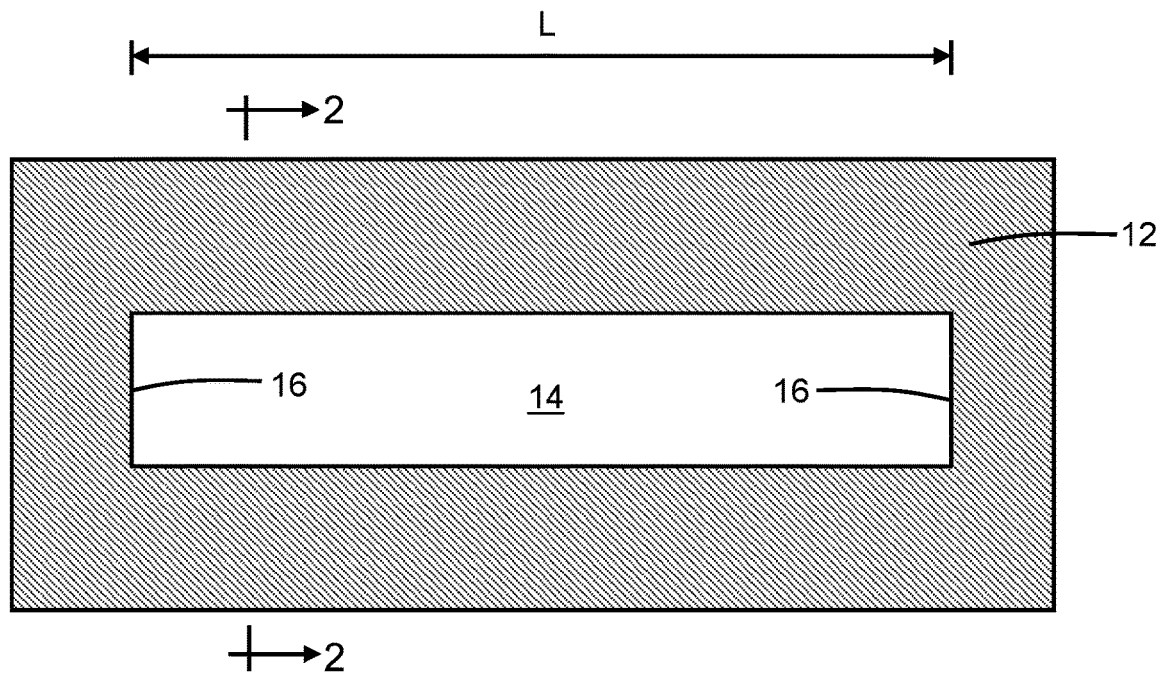
FIG. 1 is a top view of a structure at an initial fabrication stage of a processing method in accordance with embodiments of the invention.
Figure 2:
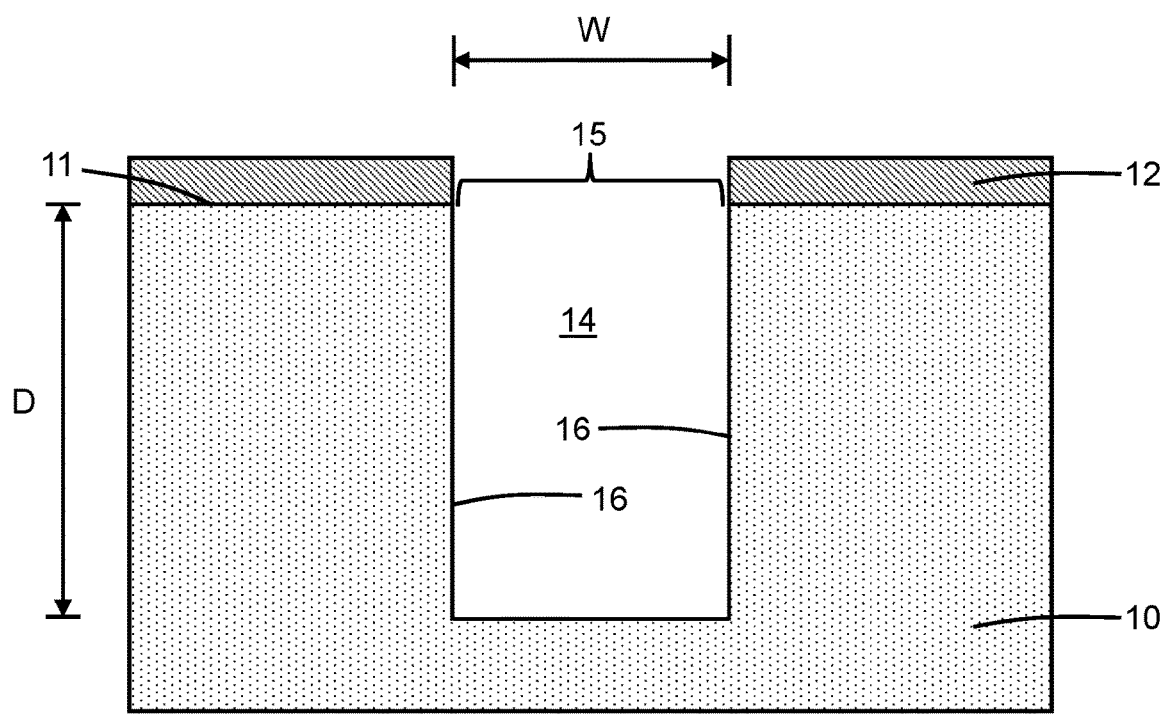
FIG. 2 is a cross-sectional view taken generally along line 2-2 in FIG. 1.

With reference to FIGS. 1, 2 and in accordance with embodiments of the invention, a semiconductor substrate 10 is comprised of a crystalline semiconductor material, such as single-crystal silicon. The semiconductor substrate 10 may be a bulk silicon substrate. A dielectric layer 12 is formed on the semiconductor substrate 10 and patterned by lithography and etching processes to define an opening. A trench 14 is formed by an etching process in the semiconductor substrate 10 at the location of the opening in the dielectric layer 12. In an embodiment, the etching process may be an anisotropic etching process such that the trench 14 has sidewalls 16 that are oriented in a vertical or substantially vertical direction.

The sidewalls 16 of the trench 14 extend from a top surface 11 of the semiconductor substrate 10 to a base at a depth D, which may be determined by the etching process. The trench 14 has a width W, which may be determined by the lithography process, between the opposite sidewalls 16. The trench 14 may be elongated with a length L that is greater than its width W, which may enable eventual use of the trench 14 to form a microfluidic channel. The trench 14 has an entrance 15 at its mouth that is defined by the intersection with the dielectric layer 12, and the entrance 15 to the trench 14 is fully surrounded by the dielectric layer 12 and may have a width equal to the width W.

The material of the dielectric layer 12 may be chosen to etch selectively to the semiconductor material of the semiconductor substrate 10. As used herein, the terms "selective" and "selectivity" in reference to a material removal process (e.g., etching) denote that the material removal rate (i.e., etch rate) for the targeted material is higher than the material removal rate (i.e., etch rate) for at least another material exposed to the material removal process. The dielectric layer 12 may be comprised of a dielectric material, such as silicon dioxide or silicon nitride. The dielectric layer 12 may operate as a protection layer for the semiconductor substrate 10 during, for example, the etching process performed to form the trench 14.

When the opening is patterned in the dielectric layer 12 and the trench 14 is subsequently patterned in the semiconductor substrate 10, the semiconductor substrate 10 may be rotationally oriented in the lithography tool using a feature on the semiconductor substrate 10, such as a notch at a peripheral edge, as an angular reference. The opening in the dielectric layer 12 may thereby be aligned with a crystallographic plane or orientation of the crystalline semiconductor material of semiconductor substrate 10. The preferential alignment is transferred by the etching process from the opening in the dielectric layer 12 to sidewalls 16 of the trench 14. In particular, the sidewalls 16 of the trench may be each aligned with a crystallographic plane or orientation of the crystalline semiconductor material of semiconductor substrate 10. For example, the opening in the dielectric layer 12 may be oriented parallel to a direction of the semiconductor substrate 10 such that the trench 14, when formed by etching, has sidewalls 16 that are oriented parallel to the direction of the semiconductor substrate 10.

Figure 3:
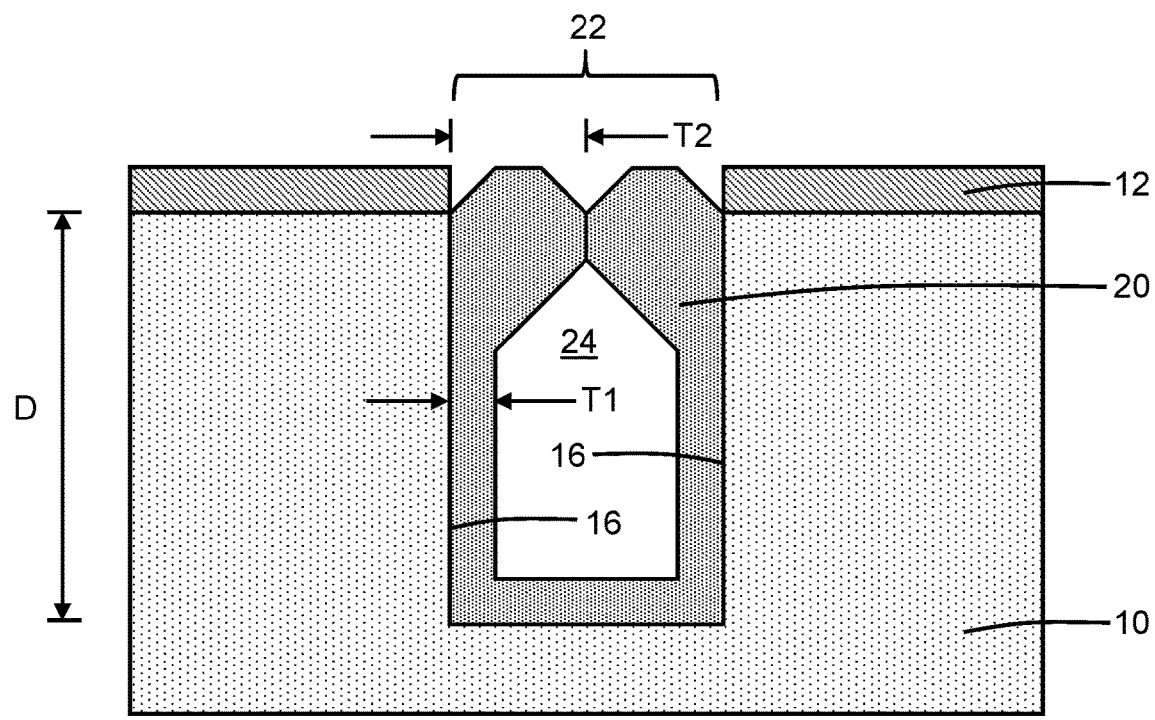
FIG. 3 is a cross-sectional view of the structure at a fabrication stage subsequent to FIG. 2.

With reference to FIG. 3 in which like reference numerals refer to like features in FIG. 2 and at a subsequent fabrication stage, a semiconductor layer 20 may be formed that lines the trench 14 and that includes a thicker portion 22 positioned inside the trench 14 adjacent to the entrance 15 to the trench 14. The thicker portion 22 pinches off the trench 14 such that the entrance 15 to the trench 14 is obstructed or blocked by a directionally-grown plug. The semiconductor layer 20 may be in direct contact with the surfaces of the semiconductor substrate 10 bordering the trench 14.

The semiconductor layer 20 surrounds a cavity 24 that remains inside the trench 14 after the thicker portion 22 obstructs or blocks the entrance 15 to the trench 14. The cavity 24 occupies a fraction of the volume of the trench 14 with the remainder occupied by the semiconductor layer 20. The portion of the semiconductor layer 20 surrounding the cavity 24 has a thickness T1. The thicker portion 22 of the semiconductor layer 20 has a thickness T2 that is greater than the thickness T1, and the thicker portion 22 extends in a vertical direction over a fraction of the depth D of the trench 14. The thickness T2 of the thicker portion 22 of the semiconductor layer 20 may be equal to one-half of the width W of the trench 14.

The semiconductor layer 20 may be formed by an epitaxial growth process. The semiconductor layer 20 may be comprised of a single-crystal semiconductor material that is epitaxially grown from the exposed surfaces of the semiconductor substrate 10 at the sidewalls 16 and base of the trench 14, which operate as growth seeds. In an embodiment, the semiconductor layer 20 may be comprised of silicon, germanium, or a combination of these materials. In an embodiment, the semiconductor layer 20 may be comprised of silicon-germanium. In an embodiment, the semiconductor layer 20 may be comprised of silicon. In an embodiment, the semiconductor layer 20 may be comprised of germanium. The thicker portion 22 of the semiconductor layer 20 results from a higher growth rate for the formation of the semiconductor layer 20 at the corners adjacent to the entrance 15 to the trench 14. The higher growth rate may result, for example, from the existence of a locally-different crystal plane for the sidewalls 16 proximate to the entrance 15 and the resulting directional growth.

Figure 4:
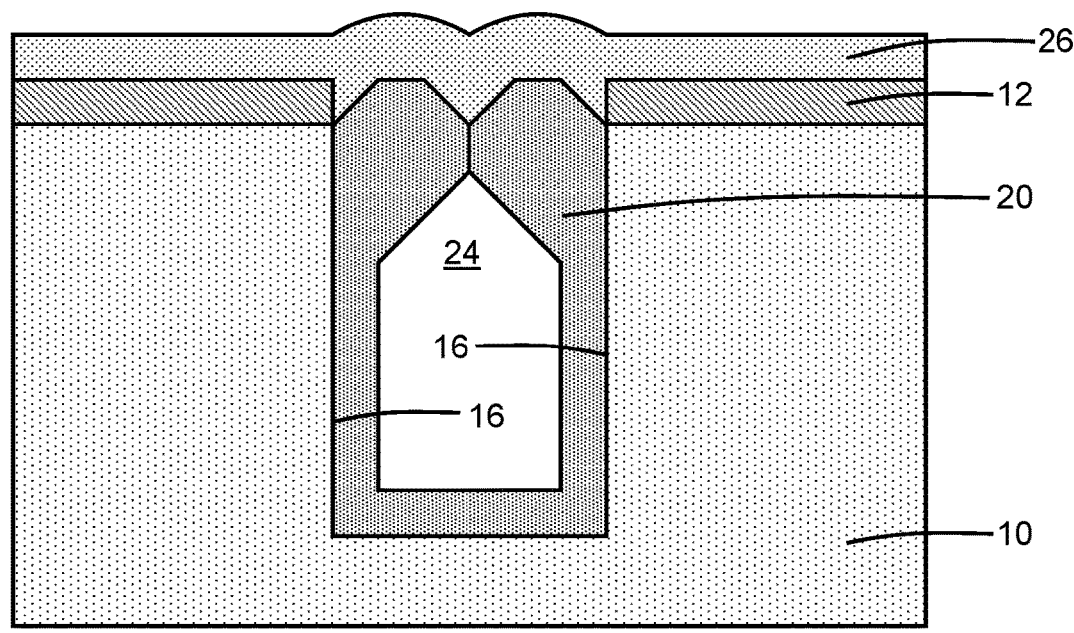
FIG. 4 is a cross-sectional view of the structure at a fabrication stage subsequent to FIG. 3.

With reference to FIG. 4 in which like reference numerals refer to like features in FIG. 3 and at a subsequent fabrication stage, a layer 26 may be applied that extends across the thicker portion 22 of the semiconductor layer 20 and the dielectric layer 12 surrounding the entrance 15 to the trench 14. A portion of the layer 26 bridges across the entrance 15 to the trench 14 and the thicker portion 22 of the semiconductor layer 20, and this portion of the layer 26 may acquire the topography of the thicker portion 22 of the semiconductor layer 20 above the trench 14. A portion of the layer 26 is also formed on the dielectric layer 12. In an embodiment, the layer 26 may be comprised of a semiconductor material, such as silicon. In an embodiment, the portion of the layer 26 on the dielectric layer 12 may be comprised of a polycrystalline semiconductor material and the portion of the layer 26 on the thicker portion 22 of the semiconductor layer 20 may be comprised of a single-crystal semiconductor material. In an alternative embodiment, the layer 26 may be comprised of a dielectric material, such as silicon nitride.

The cavity 24 may define a microfluidic channel for use as a fluid passage. A directionally-grown plug for the cavity 24 is provided by the thicker portion 22 of the semiconductor layer 20. The formation of the microfluidic channel may be simplified in comparison with conventional methods of forming a microfluidic channel.

Figure 5:
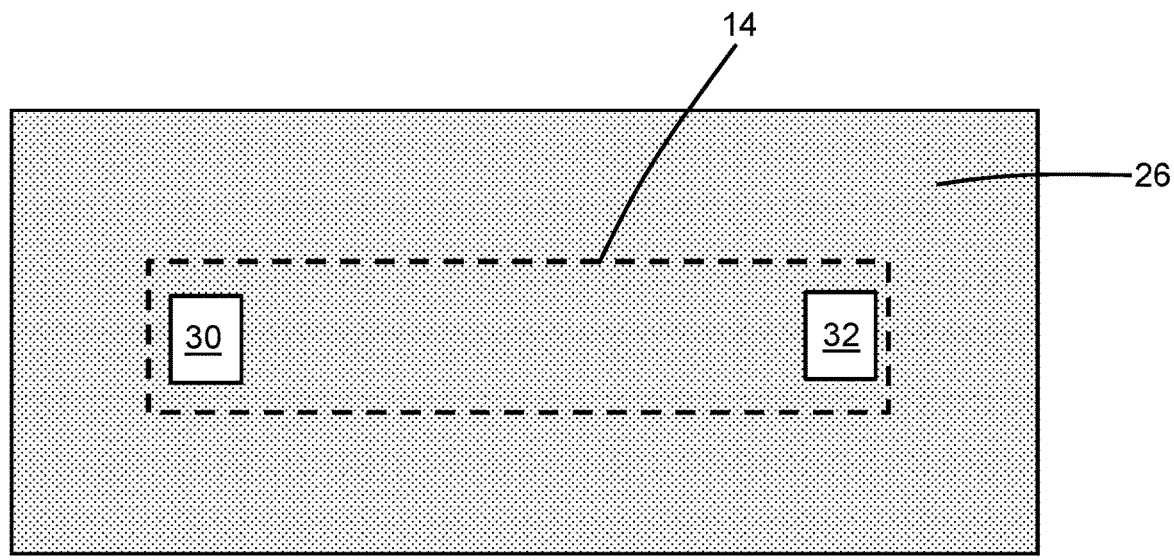
FIG. 5 is a cross-sectional view of a structure in accordance with alternative embodiments.

With reference to FIG. 5 and in accordance with alternative embodiments, the cavity 24 may have an inlet for fluid ingress and an outlet for fluid egress. For example, the cavity 24 may have an inlet 30 and an outlet 32 that penetrate through the layer 26 and the thicker portion 22 of the semiconductor layer 20 to the cavity 24. The inlet 30 and outlet 32 may be formed by patterning openings by lithography and etching processes that penetrate through the layer 26 and the thicker portion 22 of the semiconductor layer 20.

Figure 6:
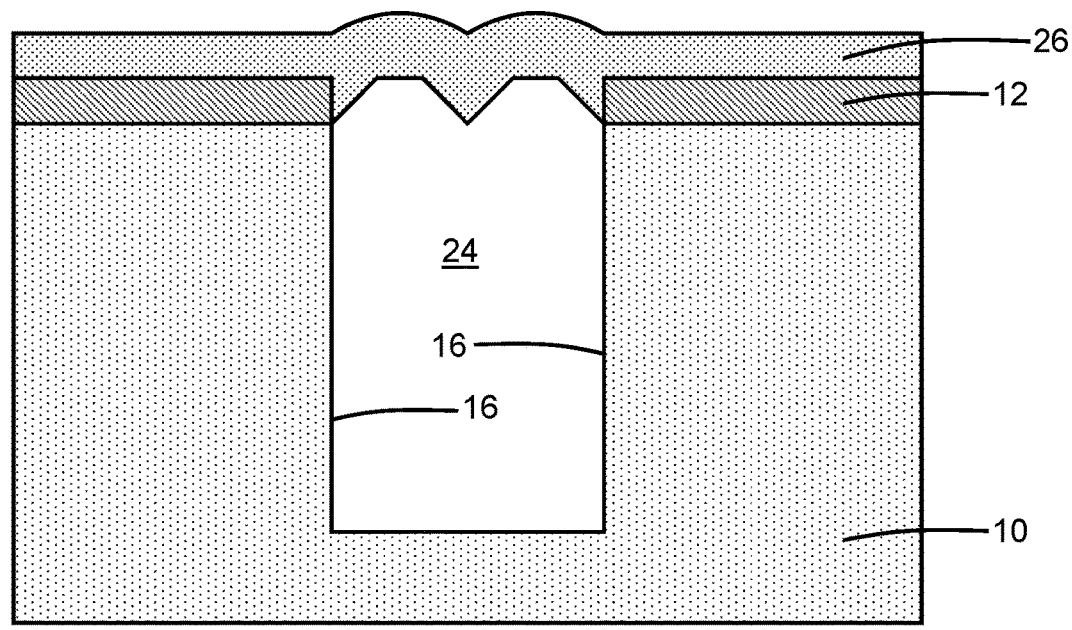
FIG. 6 is a cross-sectional view of a structure in accordance with alternative embodiments.

With reference to FIG. 6 and in accordance with alternative embodiments, the semiconductor layer 20 may be selectively etched and removed selective to the layer 26. The layer 26 bridges across the entrance 15 to the cavity 24, which is enlarged by the removal of the semiconductor layer 20.

Figure 7:
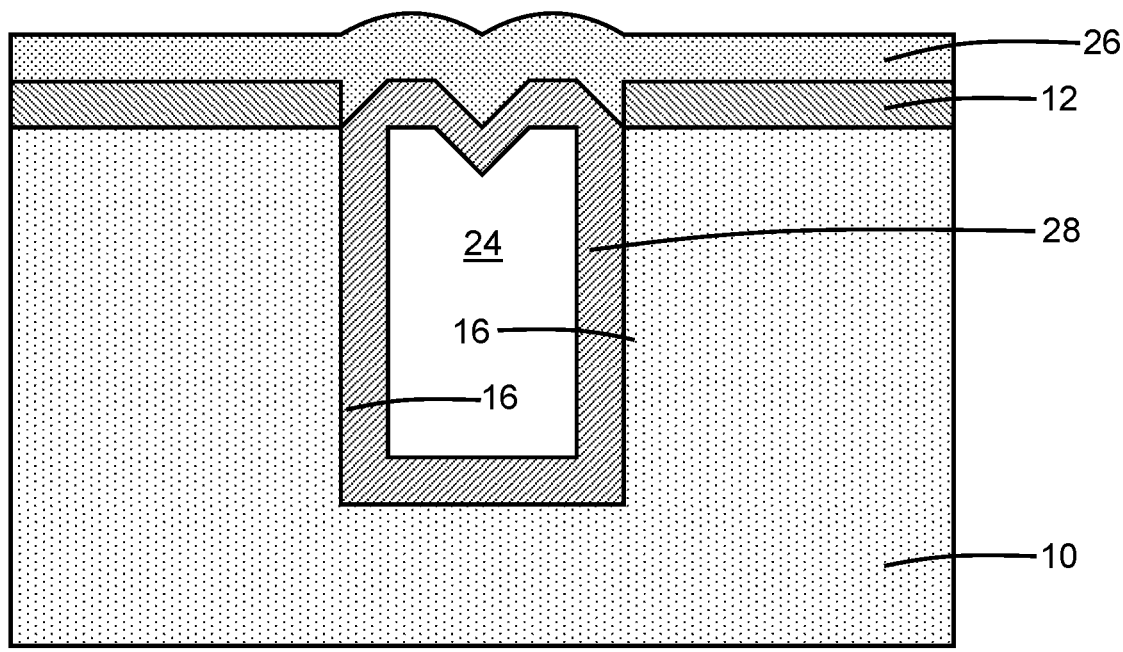
FIG. 7 is a cross-sectional view of a structure in accordance with alternative embodiments.

With reference to FIG. 7 and in accordance with alternative embodiments, the semiconductor layer 20 may be selectively etched and removed selective to the layer 26, and a dielectric layer 28 may be formed inside the trench 14 that surrounds the cavity 24. The dielectric layer 28 partially fills the trench 14 such that the microfluidic channel defined by the cavity 24 can support fluid flow.

Figure 8:
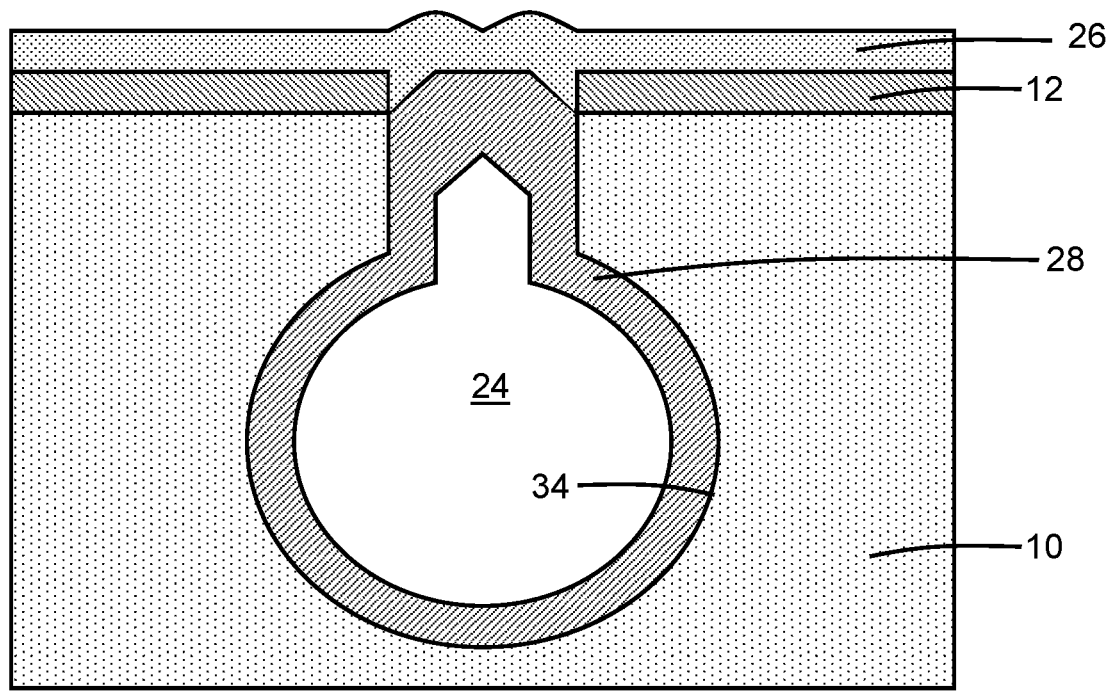
FIG. 8 is a cross-sectional view of a structure in accordance with alternative embodiments.

With reference to FIG. 8 and in accordance with alternative embodiments, the trench 14 may be formed with portions of different geometrical shape by, for example, performing one or more isotropic etching processes. For example, following an initial anisotropic etching process partially forming the trench 14, the trench 14 may be subsequently etched by an isotropic etching process to produce a lower portion that is cylindrical with a curved sidewall 34. An upper portion of the trench 14 may retain the geometrical shape (e.g., rectangular shape) existing after the initial anisotropic etching process and before the isotropic etching process completing the formation of the trench 14. In alternative embodiment, the etching process may be adjusted such that the lower portion of the trench 14 has a faceted geometrical shape instead of a cylindrical geometrical shape. The cavity 24 defined when the trench 14 is sealed by the semiconductor layer 20 may adopt the geometrical shape of the trench 14.

The methods as described above are used in the fabrication of integrated circuit chips. The resulting integrated circuit chips can be distributed by the fabricator in raw wafer form (e.g., as a single wafer that has multiple unpackaged chips), as a bare die, or in a packaged form. The chip may be integrated with other chips, discrete circuit elements, and/or other signal processing devices as part of either an intermediate product or an end product. The end product can be any product that includes integrated circuit chips, such as computer products having a central processor or smartphones.

References herein to terms modified by language of approximation, such as "about", "approximately", and "substantially", are not to be limited to the precise value specified. The language of approximation may correspond to the precision of an instrument used to measure the value and, unless otherwise dependent on the precision of the instrument, may indicate a range of +/−10% of the stated value(s).

References herein to terms such as "vertical", "horizontal", etc. are made by way of example, and not by way of limitation, to establish a frame of reference. The term "horizontal" as used herein is defined as a plane parallel to a conventional plane of a semiconductor substrate, regardless of its actual three-dimensional spatial orientation. The terms "vertical" and "normal" refer to a direction in the frame of reference perpendicular to the horizontal, as just defined. The term "lateral" refers to a direction in the frame of reference within the horizontal plane.

A feature "connected" or "coupled" to or with another feature may be directly connected or coupled to or with the other feature or, instead, one or more intervening features may be present. A feature may be "directly connected" or "directly coupled" to or with another feature if intervening features are absent. A feature may be "indirectly connected" or "indirectly coupled" to or with another feature if at least one intervening feature is present. A feature "on" or "contacting" another feature may be directly on or in direct contact with the other feature or, instead, one or more intervening features may be present. A feature may be "directly on" or in "direct contact" with another feature if intervening features are absent. A feature may be "indirectly on" or in "indirect contact" with another feature if at least one intervening feature is present. Different features may "overlap" if a feature extends over, and covers a part of, another feature with either direct contact or indirect contact.

The descriptions of the various embodiments of the present invention have been presented for purposes of illustration but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A structure comprising:
   a semiconductor substrate including a trench, the trench having an entrance and a sidewall extending from the entrance into the semiconductor substrate;
   a semiconductor layer inside the trench, the semiconductor layer having a first portion surrounding a portion of the trench to define a cavity and a second portion positioned to obstruct the entrance to the trench, and the second portion of the semiconductor layer thicker than the first portion of the semiconductor layer;
   a dielectric layer on the semiconductor substrate, the dielectric layer fully surrounding the entrance to the trench; and
   a layer having a first portion on the dielectric layer and a second portion on the second portion of the semiconductor layer, the first portion of the layer comprising a polycrystalline semiconductor material, and the second portion of the layer comprising a single-crystal semiconductor material.

2. The structure of claim 1 wherein the cavity has an inlet and an outlet, and the inlet and the outlet each extend through the layer and the second portion of the semiconductor layer.

3. The structure of claim 1 wherein the semiconductor layer comprises silicon.

4. The structure of claim 1 wherein the trench has a width, and the second portion of the semiconductor layer has a thickness that is substantially equal to one-half of the width.

5. The structure of claim 1 wherein the cavity has an inlet and an outlet.

6. The structure of claim 5 wherein the inlet and the outlet each penetrate through the second portion of the semiconductor layer to the cavity.

7. The structure of claim 5 wherein the cavity is configured to provide a microfluidic channel between the inlet and the outlet.

8. The structure of claim 1 wherein the trench includes a first portion with a first geometrical shape and a second portion with a second geometrical shape different from the first geometrical shape.

9. The structure of claim 8 wherein the first geometrical shape is rectangular.

10. The structure of claim 8 wherein the second geometrical shape is cylindrical.

11. The structure of claim 1 wherein the semiconductor layer is in direct contact with surfaces of the semiconductor substrate bordering the trench.

12. The structure of claim 1 wherein the semiconductor layer comprises silicon-germanium.

13. The structure of claim 1 wherein the semiconductor layer comprises germanium.

14. The structure of claim 1 wherein the sidewall of the trench has a plurality of corners adjacent to the entrance, and the second portion of the semiconductor layer is disposed on the plurality of corners.

15. The structure of claim 1 wherein the semiconductor layer comprises silicon, germanium, or a combination thereof.

16. A method comprising:
    forming a trench in a semiconductor substrate, wherein the trench has an entrance and a sidewall extending from the entrance into the semiconductor substrate;
    forming a dielectric layer on the semiconductor substrate, wherein the dielectric layer fully surrounds the entrance to the trench;
    forming a semiconductor layer inside the trench, wherein the semiconductor layer has a first portion surrounding a portion of the trench to define a cavity and a second portion positioned to obstruct the entrance to the trench, and the second portion of the semiconductor layer is thicker than the first portion of the semiconductor layer; and
    forming a layer having a first portion on the dielectric layer and a second portion on the second portion of the semiconductor layer, wherein the first portion of the layer comprises a polycrystalline semiconductor material, and the second portion of the layer comprises a single-crystal semiconductor material.

17. The method of claim 16 wherein the semiconductor layer is formed by an epitaxial growth process.

18. The method of claim 16 further comprising:
    removing the semiconductor layer from the trench.

19. The method of claim 18 further comprising:
    after removing the semiconductor layer from the trench, forming a second dielectric layer surrounding the portion of the trench to define the cavity.

20. The method of claim 16 further comprising:
    forming an inlet and an outlet each penetrating through the layer and the second portion of the semiconductor layer to the cavity.

* * * * *